United States Patent
Sinha

(10) Patent No.: US 8,667,806 B2
(45) Date of Patent: Mar. 11, 2014

(54) EFFICIENT PHOTOVOLTAIC (PV) CELL BASED HEAT PUMP LIQUID HEATER

(75) Inventor: Sunil Kumar Sinha, Houston, TX (US)

(73) Assignee: Airgenerate, LLC, Houston, TX (US)

( * ) Notice: Subject to any disclaimer, the term of this patent is extended or adjusted under 35 U.S.C. 154(b) by 886 days.

(21) Appl. No.: 12/586,301

(22) Filed: Sep. 21, 2009

(65) Prior Publication Data

US 2011/0067424 A1    Mar. 24, 2011

(51) Int. Cl.
*F25B 27/00* (2006.01)

(52) U.S. Cl.
USPC .......................................... 62/235.1; 62/236

(58) Field of Classification Search
USPC ........... 62/235.1, 236, 238.7, 324.1; 136/246, 136/244, 251
See application file for complete search history.

(56) References Cited

U.S. PATENT DOCUMENTS

| | | |
|---|---|---|
| 4,390,008 A | 6/1983 | Andrews |
| 4,404,958 A | 9/1983 | Boettcher |
| 4,507,936 A | 4/1985 | Yoshino |
| 7,441,558 B2 * | 10/2008 | Leifer et al. .................. 126/617 |

\* cited by examiner

*Primary Examiner* — Mohammad M Ali
(74) *Attorney, Agent, or Firm* — Egbert Law Offices, PLLC

(57) ABSTRACT

A heat pump liquid heater (HPLH) system coupled to an array of photovoltaic cells that operate at enhanced efficiency is disclosed. The HPLH system comprises a panel or a box structure coupled to the HPLH. The box structure supports an array of photovoltaic cells and a circulation mechanism. The HPLH generates a coolant as a by-product using ambient air and electric power. The coolant that is circulated around the photovoltaic cells may extract the heat generated by the photovoltaic cells and the temperature of the photovoltaic cells may decrease to a specific level or maintained within an allowable temperature range. The reduction in temperature causes the photovoltaic cells to operate with enhanced efficiency and may generate more electric power. The size of the panel or the number of photovoltaic cells required to generate a required power may be reduced that reduces the cost of the HPLH system.

5 Claims, 9 Drawing Sheets

EFFICIENT PHOTOVOLTAIC (PV) CELL BASED HEAT PUMP LIQUID HEATER

FIELD OF INVENTION

The present invention relates to liquid heating systems using non-conventional energy and more specifically to an efficient photovoltaic cell based heat pump liquid heater.

BACKGROUND OF THE INVENTION

Photovoltaic (PV) cells, which are essentially semiconductor junctions are used extensively to generate electric power from the light energy such as the solar energy. The photons present in the incident sunlight is absorbed by the semiconducting material of the PV cell 100 and the electrons are knocked loose from the atom, allowing the electrons to flow through the material to produce electricity. Presently, photovoltaic cell arrays are widely used in energy conversion arrangements such as solar panels, for example.

A panel may comprise an array of PV cells and the PV cells convert the incident solar rays into electric values such as voltage and current. The photovoltaic cells have provided a very useful means to convert solar energy into electric power. FIG. 1A depicts an electric equivalent of a photovoltaic cell 100. The photovoltaic cell 100 may be represented as a combination of a current source 110, a diode 120, and resistors R130 and R140. The photovoltaic cell 100 absorbs photons present in the incident solar rays 105-A to 105-K and converts the energy associated with the photons into voltage V120 and/or current I-185. The current I-185 is provided by the Equation (1) below.

$$I\text{-}185 = (I\text{-}115) - (I\text{-}125) - (I\text{-}155) \quad \text{Equation (1)}$$

wherein I-185 represents output current, I-115 represents the photocurrent generated by the current source 110, current I-125 represents the diode current that flows through the diode 120, I-155 represents the current flowing through the shunt resistor R130 connected across the current source 110. The voltage V121 across the resistor R130 is given by Equation (2) below.

$$V121 = V120 + (I\text{-}185 * R140) \quad \text{Equation (2)}$$

The current I-125, which flows through the diode 120 is provided by Equation (3) below $$I\text{-}125 = Irevsat\{\exp(qVj/nkT)/-1\} \quad \text{Equation (3)}$$

wherein Irevsat is the reverse saturation current, n is the diode ideality factor, q is the elementary charge, k is Boltzmann's constant, T is the absolute temperature.

Also, the current I-155 flowing through the shunt resistor R130 is given by Equation (4) below $$I\text{-}155 = V121/R130 = (V120 + (I\text{-}185 * R140))/R130 \quad \text{Equation (4)}$$

Equation (5) below is arrived at by substituting Equations (3) and (4) in Equation (1), Equation (5) indicates that an inverse relationship exists between the output current (I-185) and the temperature (T).

$$I\text{-}185 = I\text{-}115 - (Irevsat\{\exp(qVj/nkT) - 1\}) - (V120 + (I\text{-}185 * R140))/R130 \quad \text{Equation (5)}$$

Unfortunately, the solar rays incident on the photovoltaic cells increase the temperature of the photovoltaic cell and the capacity of the photovoltaic cell to generate electric power is affected by the increase in temperature. The increase in the temperature is caused by the difference in energy between the photons and the silicon band gap that is converted into heat. As shown in Equation (2), the increase in temperature decreases the current I-225 and the current I-285 delivered by the photovoltaic cell 100. The voltage and the current generated by the photovoltaic cell decreases, for example, by 20% as the temperature increases by about 30 degree Fahrenheit. Also, the present day heat pump liquid heaters merely use the power generated by the photovoltaic cell arrays. Therefore, there is a need to increase the efficiency of the photovoltaic cell based heater pump liquid heater systems.

FIG. 1B illustrates a graph of current I-185 vs. voltage V120. The graph depicts a decrease in the voltage V120 and the current I-285 with an increase in the temperature T of the PV cell 100. The plot 140 depicts current I-185 plotted along Y-axis and the voltage V120 plotted along X-axis. The plot 150, 160, and 170 represents the variation of current I-185 versus voltage V120 for temperatures of 20 degree centigrade, 40 degree centigrade, and 60 degree centigrade, respectively. As the temperature of the photovoltaic cell 100 increases the efficiency of the photovoltaic cell 100 drops almost to 20% and to compensate for the drop in voltage V120, the present day solar panels add 20% additional cells to compensate for the drop in voltage V120. The usage of 20% additional PV cells increases the size and cost of the solar panels. Therefore there is a need to improve the efficiency of the PV cells.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

The following description describes a method and an apparatus to enhance efficiency of PV cells based heat pump liquid heater. In the following description, numerous specific details and choices are set forth in order to provide a more thorough understanding of the present invention. It will be appreciated, however, by one skilled in the art that the invention may be practiced without such specific details. In other instances, constructional details and other such details have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The above disadvantages of the prior art are over-come by the present invention wherein an efficient photovoltaic cell array based heat pump liquid heater is a standalone system with a circulation system provisioned around the photovoltaic cell array to increase the efficiency of the photovoltaic cells. In one embodiment, the circulation system provisioned around the photovoltaic cell array supports circulation of a coolant around the PV cells to reduce the temperature of the PV cells. Such an arrangement, while reducing the temperature of the PV cells may also increase the electric power generated by the PV cells.

In one embodiment, a heat pump liquid heater may be coupled to the array of PV cells arranged on a panel housing the circulation system. In one embodiment, the heat pump liquid heater may generate cool air or cold liquid (referred to as 'coolant') as a by-product and such a by-product may be used to increase the efficiency of the PV cells. As the heat pump liquid heater generates coolant as a by-product, it may not be required to consume additional power to generate the coolant.

Figure 1A:
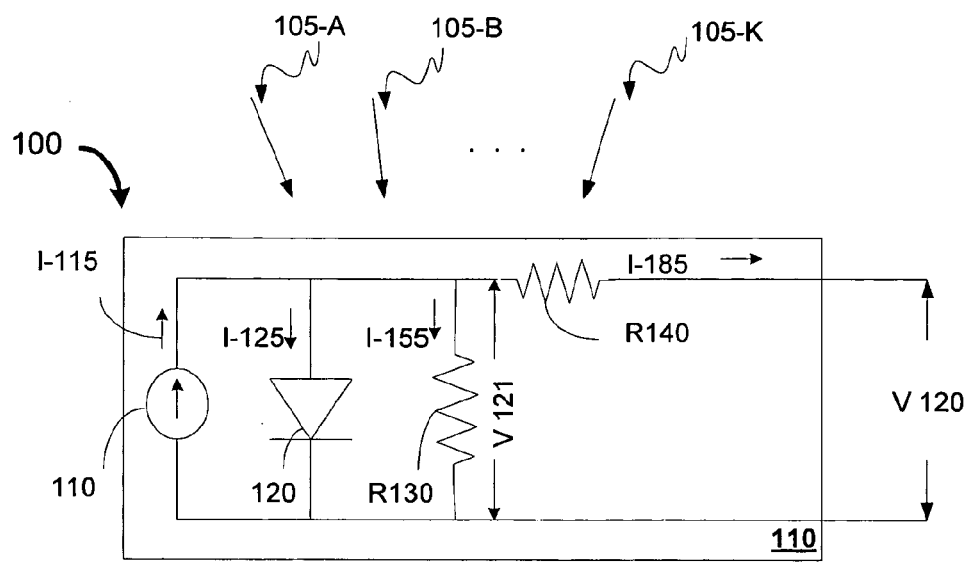
FIG. 1A illustrates an electric equivalent of a photovoltaic cell 100.
Figure 1B:
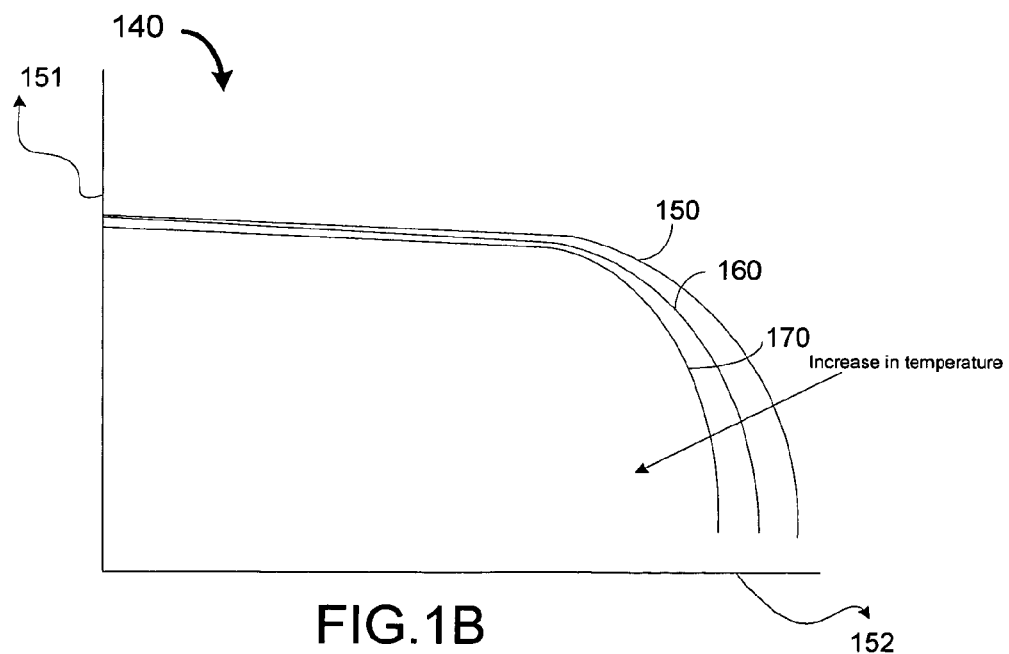
FIG. 1B depicts a graph 140, which illustrates the effect of temperature on the current and voltage generated by the photovoltaic cell 100.

An embodiment of a panel 200 that supports an array of PV cells and a circulation system, which together enhances the efficiency of the array of the PV cells is illustrated in FIG. 1. In one embodiment, the panel 200 may comprise a box structure 211 with a top surface 210, a bottom surface, and one or more side surfaces. In one embodiment, the one or more side surfaces may be provisioned between the top surface 210 and the bottom surface at substantially right angles to the edges of the top surface 210 and the bottom surface. In one embodiment, the side surface may comprise an inlet 230 and an outlet 240 for circulating the coolant. In other embodiment, the bottom surface may comprise inlet and outlet to allow entry and exit of the coolant. In one embodiment, an array of PV cells 213-1A to 213-KN may be arranged on the upper surface 210 of the box structure 211. In one embodiment, the PV cells 213-1A to 213-KN may generate current and voltage in response to incident sunrays.

In addition to the electricity generated, the temperature of the photovoltaic cells 213-1A to 213-KN may increase as well. As a result, the electric output generated by the PV cells 213-1A to 213-KN may decrease. To enhance the efficiency of the array of PV cells 213-1A to 213-KA, a coolant may be circulated through a circulation system housed within the box structure 211 to decrease the temperature of the PV cells 213-1A to 213-KN. In one embodiment, a decrease in the temperature or removing the heat from the PV cells 213-1A to 213-KN may enhance the efficiency of the PV cells 213-1A to 213-KN by increasing the electric output of the PV cells 213-1A to 213-KN. In one embodiment, the increase in the efficiency of the PV cells 213 may avoid provisioning of at least 20% additional PV cells and the panel area required to house the 20% additional PV cells.

Figure 2:
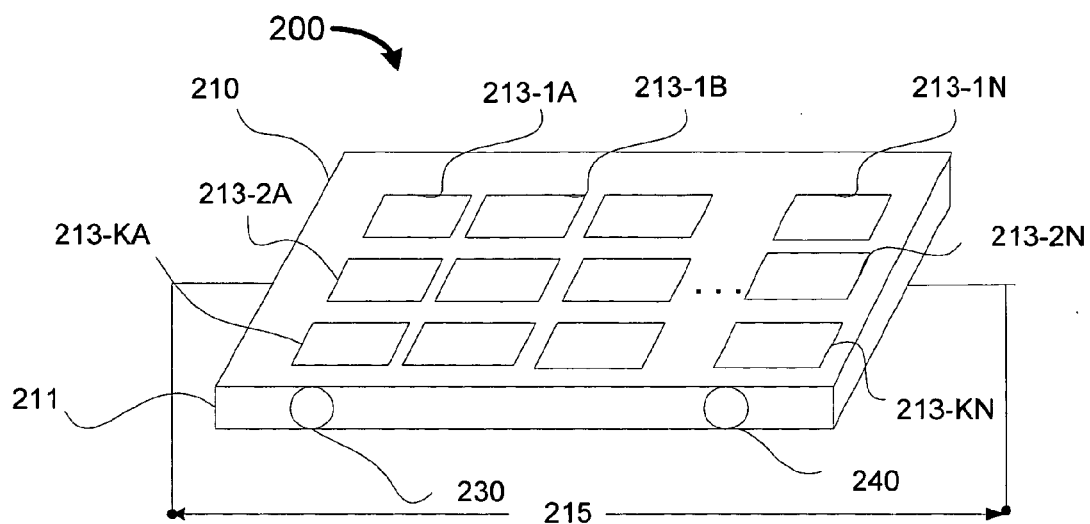
FIG. 2 illustrates a panel 200 comprising photovoltaic cell array arranged in accordance with an embodiment.
Figure 3:
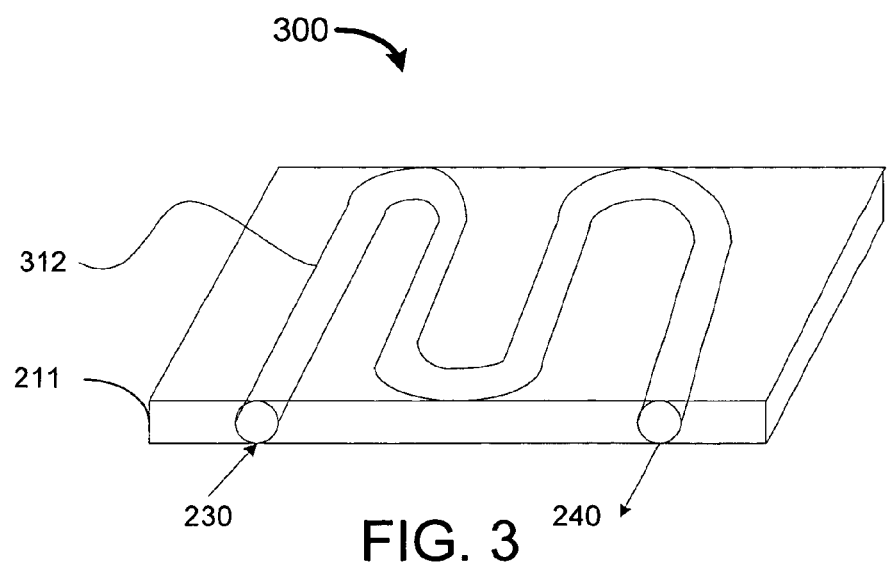
FIG. 3 illustrates a circulation arrangement provided within the panel of FIG. 2 in accordance with an embodiment.

An embodiment of a circulation system 300, which may be housed within the box structure 211 is illustrated in FIG. 2. In one embodiment, the circulation system 300 may comprise pipes 312 formed into shapes such that the pipes 312 run through the box structure 211 underneath the PV cells 213-1A to 213-KN. In one embodiment, the pipe may be made of metals that have superior heat transfer capabilities. In one embodiment, the pipes may be constructed using copper, brass, aluminum, and such other metals that have superior heat transfer capabilities. In one embodiment, the coolant flowing through the heat pipes 312 may absorb the heat from the PV cells 213-1A to 213-KN. In one embodiment, the absorption of heat from the PV cells 213-1A to 213-KN may reduce the temperature of the PV cells 213 and in turn may cause the electric output to increase, thus increasing the efficiency of the PV cells 213-1A to 213-KN.

Figure 4:
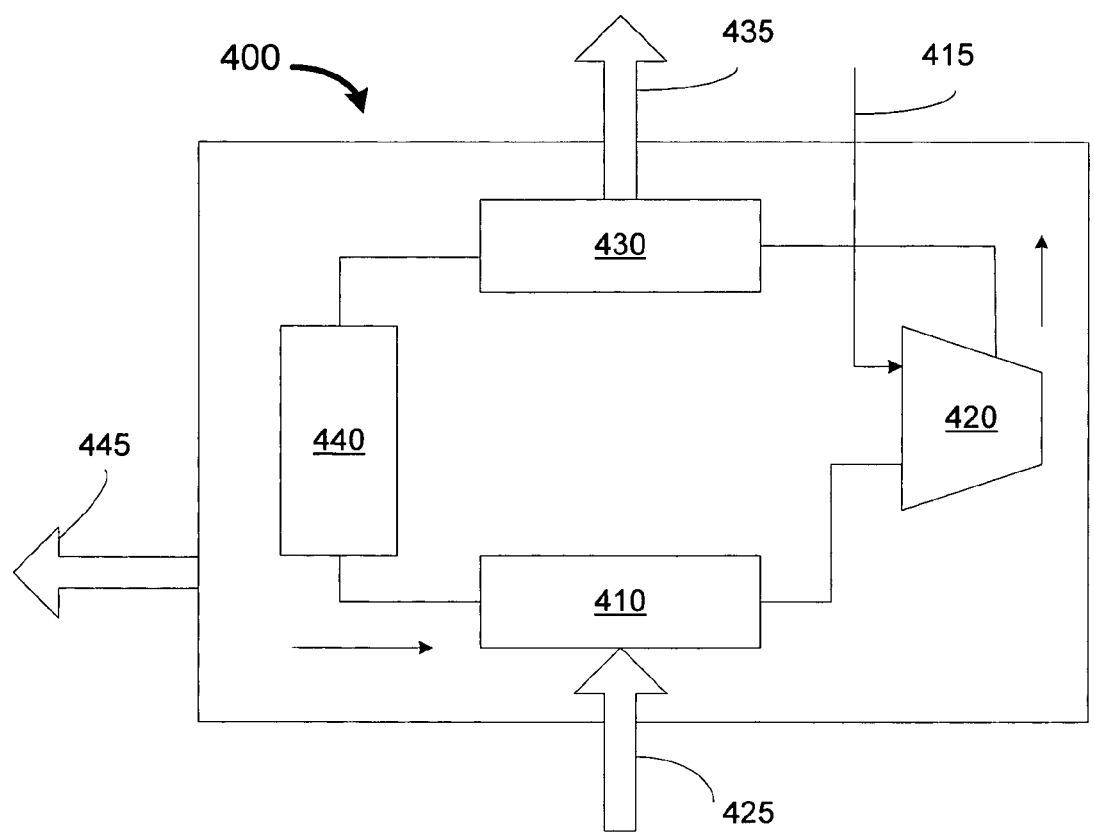
FIG. 4 illustrates a heat pump liquid heater in accordance with an embodiment.

An embodiment of a heat pump liquid heater 400, which generates coolant as a by-product is illustrated in FIG. 4. In one embodiment, the heat pump liquid heater 400 may comprise an evaporator 410, a compressor 420, a condenser 430, and an expansion valve 440. In one embodiment, the heat pump liquid heater 400 may transfer the heat from one block within the heat pump liquid heater 400 to the other block. In one embodiment, the electric power provided to the heat pump liquid heater 400 may be used by the heat pump liquid heater 400 to move the heat from one block to other within the heat pump liquid heater 400. In one embodiment, the heat pump liquid heater 400 may operate on the principle of reverse refrigeration cycle.

In one embodiment, the electric power may be provided to the heat pump liquid heater 400 on path 415. In one embodiment, the electric power may be provided from an electric power supply source or from electricity generated by the array of photovoltaic cells. In one embodiment, the electric power is provided to the compressor 420.

In one embodiment, the evaporator 410 may extract heat from the air in the surrounding environment as shown by the arrow 425. In one embodiment, the evaporator 410 may provide the air to the compressor 420. In one embodiment, the ambient temperature of the air that is extracted by the evaporator 410 may be 70-80 degree Fahrenheit. For example, the electric equivalent of the heat energy that is extracted from the ambient air may equal 3 kilowatt-hour.

In one embodiment, the compressor 420 may compress the air to generate air in liquid state, which may be at high temperature and pressure. In one embodiment, the compressor 420 may receive, for example, one kilowatt hour (kwh) of power from the electric source. In one embodiment, the output of the compressor 420 may be provided to the condenser 430.

In one embodiment, the condenser 430 may receive air in liquid form, which is under high pressure and high temperature state and may transfer the heat from the air in liquid form on a path 435. In one embodiment, the heat is that is generated by the compressor 430 may be referred to hot air and the hot air may be used for heating the liquid. In one embodiment, the hot air may be used to heat liquid in a domestic, industrial, and other such set-ups. In one embodiment, the condenser 430 may provide the air under high-pressure state to the expansion valve 440.

In one embodiment, the heat extracted from the liquid air at high temperature and pressure may be used to heat liquid. In one embodiment, the path 435 may carry the heat that is used to heat the liquid. In one embodiment, the electrical equivalent of the heat energy that is available for heating the liquid may equal 4 kilo-watt hour (kwh). In one embodiment, the 4 kwh equivalent of heat available may be caused by the 3 kwh associated with the heat extracted from the ambient air and the 1 kwh of electric power provided to the compressor 420. Thus, the efficiency of the heat pump liquid in this example may equal 400%.

In one embodiment, the expansion valve 440 may allow expansion of air received from the condenser 430. In one embodiment, the expansion valve 440 may generate air at a lower temperature (cool air) by allowing the air at high pressure to expand instantaneously. In one embodiment, the cool air may be provided as a by-product output on path 445.

In one embodiment, the heat pump liquid heater 400 may provide hot air and cold air (or coolant) as outputs, respectively, on paths 435 and 445 in response to receiving an electric power on path 415 and air at ambient temperature on path 425.

Figure 5:
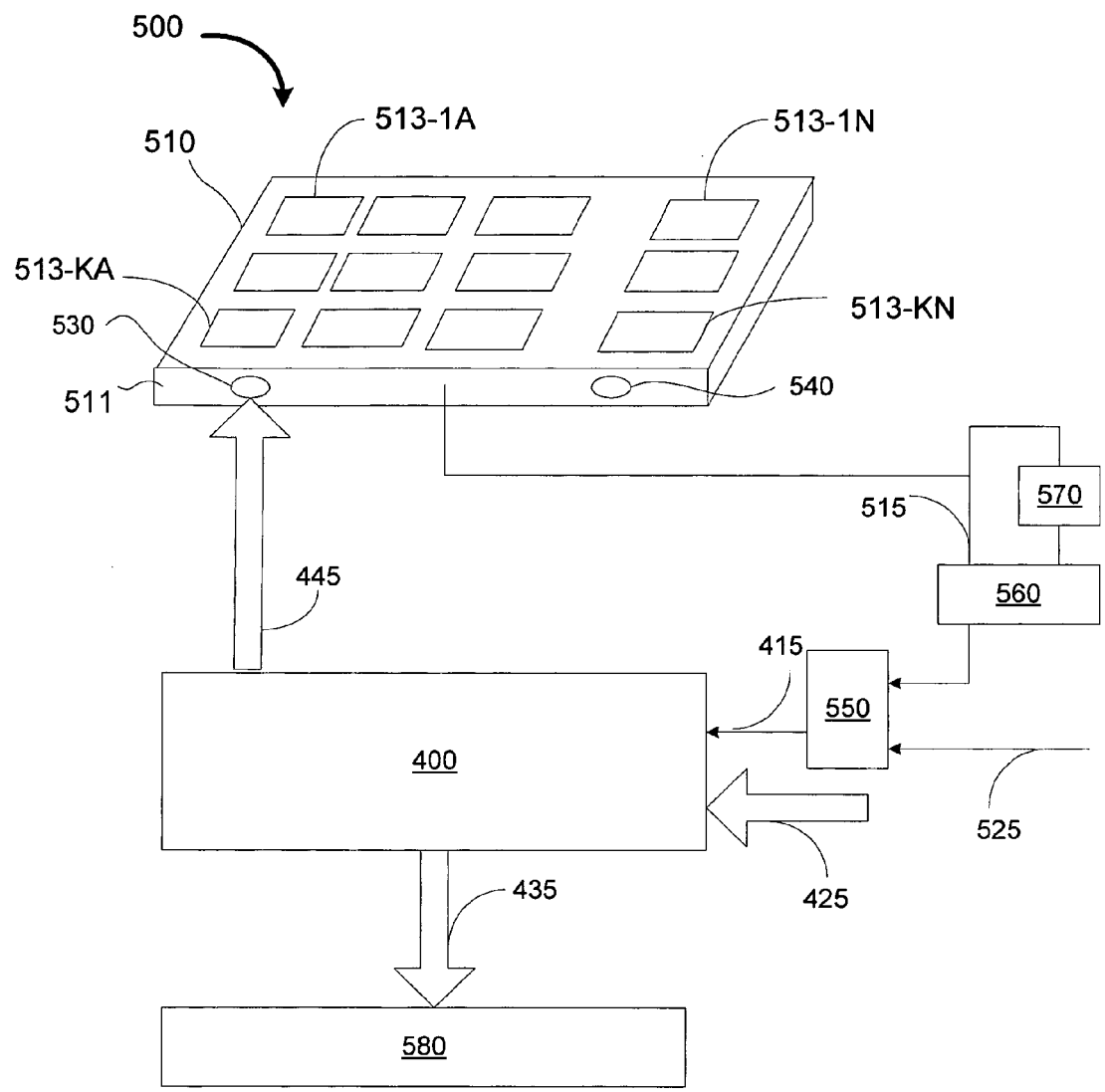
FIG. 5 illustrates a panel housing an efficient PV cell array, which is coupled to a heat pump liquid heater arranged in a first configuration in accordance with an embodiment.

An embodiment of a heat pump liquid heater coupled to an array of photovoltaic cells operating at enhanced efficiency and arranged according to a first configuration is illustrated in FIG. 5. In one embodiment, the arrangement 500 may comprise a box structure 511 having a top surface 510 and an inlet 530 and an outlet 540. In one embodiment, the box structure 511 may support a circulation system such as the circulation system 300. In one embodiment, photovoltaic cells 513-1A to 513-KN may be arranged on the top surface 510 of the box structure 511. In one embodiment, the photovoltaic cells 513-1A to 513-KA may generate electric power using the photons present in the incident light rays. However, the temperature of the photovoltaic cells 513 may increase after the array of PV cells 513 gets exposed to the light rays. As the temperature increases the electric power generated by the PV cells 513 decreases.

To enhance the efficiency of the PV cells 513, the output path 445 of the heat pump liquid heater 440 may be coupled to the inlet 530. In one embodiment, the coolant (cold air or cold water) generated by the heat pump liquid heater 400 may be circulated using a circulation system provisioned within the box structure 511. As a result, temperature around the PV cells 513 may be maintained within an allowable temperature band. In one embodiment, the PV cells 513 may operate at an optimal state to generate a desired electric power output without the effect of increase in temperature being felt on the performance of the PV cells 513.

In one embodiment, the hot air generated by the heat pump liquid heater 400 may be provided on path 435 to a coil dipped in liquid, for example. In one embodiment, the liquid may be heated due to passage of hot air through the coil that is immersed in the liquid. In one embodiment, the temperature around the PV cells 513 may be maintained within the allowable temperature band without affecting the heating of liquid. Heat pump liquid heaters (HPLH) 400 may provide cool gas or liquid as byproduct, which may be used to cool the photovoltaic cells 513, increasing the power produced by the photovoltaic cells 513. Heat pump liquid heater 400 may derive have heat source from any gas including air or from any liquid including water. In one embodiment, the HPLH 400 may be provided with power either, completely or partially, by a panel consisting of photovoltaic cells 513, thus reducing the need for conventional electrical energy requirement of heat pump liquid heater. The combination of heat pump liquid heater and photovoltaic power provides a synergy of higher energy efficiency, reducing overall all equipment and operational costs.

In one embodiment, the electric power generated by the PV cells 513 may be provided as an input to a switch 560 on path 515 and the other input to the switch 560 may be provided from the inverter 570. In one embodiment, the electric power may be allowed to charge the batteries of an inverter 570 and the inverter output may be provided to the switch 560. In one embodiment, the output of the switch 560 may be provided as a first input to the selector 550 and the other input may be provided from the power supply distribution network on path 525. In one embodiment, the selector 550 may provide the electric power output generated by the PV cells 513 to the compressor of the heat pump liquid heater 400. However, if the electric power from the PV cells 513 fail, the electric power from the power distribution lines may be used as a back-up source.

In one embodiment, the electric power generated by the PV cells 513 may be stored in batteries and then converted in alternating voltage or current using inverter circuitry. In one embodiment, the output of the inverter may be provided as the first input to the selector 550 on path 515.

In one embodiment, providing the coolant generated by the heat pump liquid heater 400 to the circulation system within the box structure 511 to maintain the temperature of the PV cells 513 within the temperature band enhances the efficiency of the arrangement 500. In one embodiment, the coolant generated by the heat pump liquid heater 400 is a by-product and with no additional power or cost consumed the temperature of the PV cells 513 may be maintained within the allowable temperature range.

In one embodiment, the additional PV cells 513 that may be required to generate a desired temperature may be avoided due to the enhanced efficiency with which the PV cells 513 operate. In one embodiment, avoiding the use of additional PV cells may decrease the size of the top surface 510 and may decrease the cost of the panel. In one embodiment, if the required electric power output is X and the number of PV cells 513 required to generate the power output X may be Y. In the absence of the cooling arrangement 500, the PV cells 513 may generate (X−x1) kilowatts.

However, to maintain the electric power output at a level X, the number of PV cells that may be required may equal (Y+y1). In one embodiment, 'y1' may computed based on the decrease in the electric power output in the absence of the cooling mechanism depicted in FIG. 5. If the decrease in electric power output due to increase in temperature around the PV cells 513 is 20% of X, then 'y1' may be determined such that the 20% decrease in the electric power output is compensated.

However, with the enhanced efficiency of the PV cells 513, the number of PV cells required to generate the electric power output of X may equal Y. In one embodiment, such an approach may avoid usage of additional 'y1' PV cells. In one embodiment, the cost incurred on additional 'y1' PV cells and the space on the top surface 510 may decrease the cost of ownership of a heating system such as the one depicted in arrangement 500 of FIG. 5.

Figure 6:
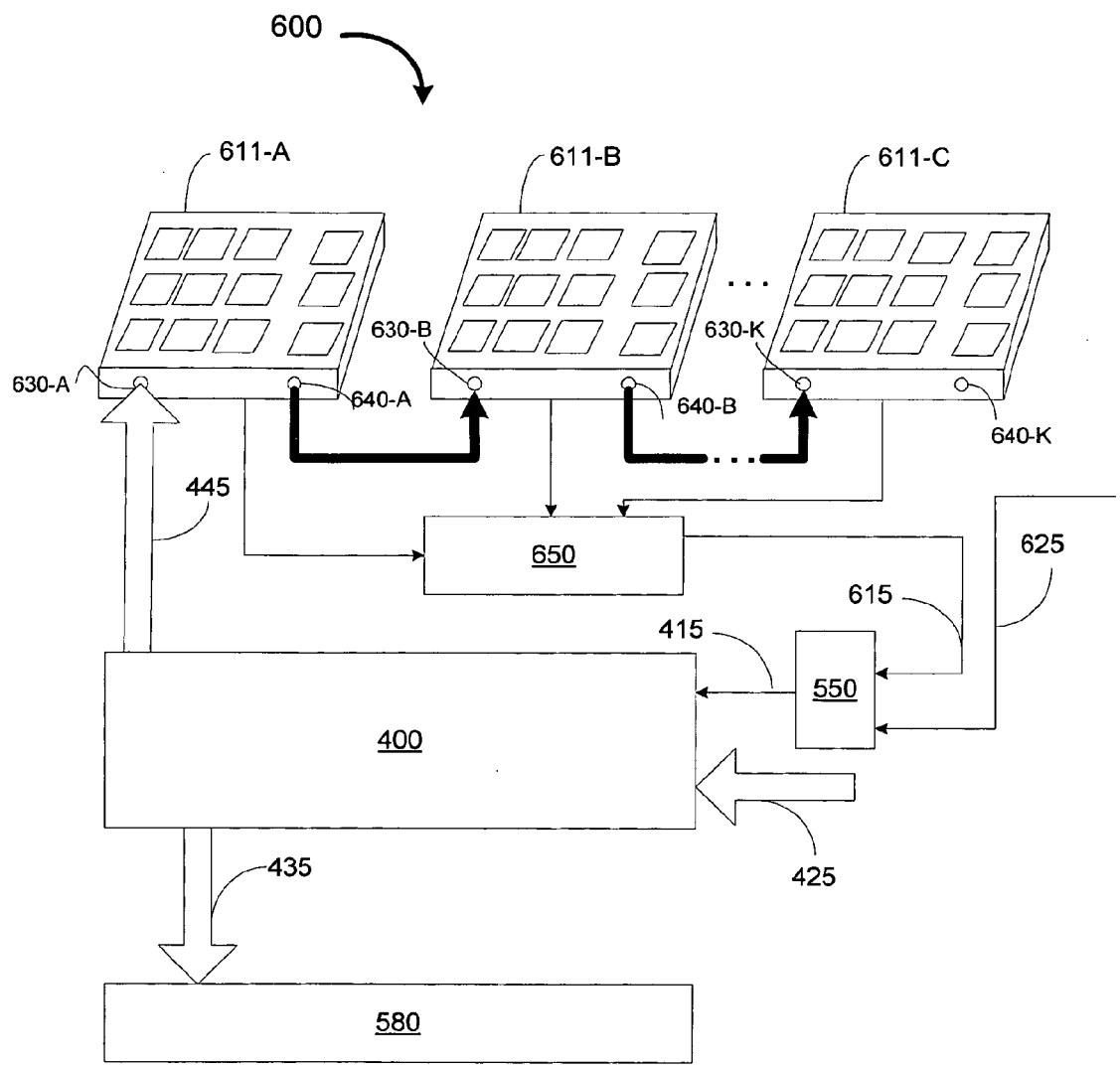
FIG. 6 illustrates a panel housing an efficient PV cell array, which is coupled to a heat pump liquid heater arranged in a second configuration in accordance with an embodiment.

An embodiment of a heat pump liquid heater coupled to an array of photovoltaic cells operating at enhanced efficiency and arranged according to a second configuration is illustrated in FIG. 6. In one embodiment, the heat generated by heat pump liquid heater 400 on the output 435 may be passed through a coil dipped in a liquid and the arrangement may be housed within block 580.

In one embodiment, the arrangement 600 may comprise a plurality of box structures 611-A to 611-K that may be similar to the box structure 511 of FIG. 5. Each of the structures 611-A to 611-K may comprise a circulation system and an array of PV cells. In one embodiment, the structures 611-A to 611-K may be arranged such that the coolant entering the first structure 611-A through the inlet 630-A may exit through the outlet 640-A and the outlet 640-A may be coupled to the inlet 630-B of the adjacent structure 611-B. In one embodiment, the outlet 640-B of the structure 611-B may be coupled to the inlet of the adjacent structure. In one embodiment, the coolant may get circulated from one structure 611-A to the other structure 611-B in a series configuration.

Such a series arrangement may be used to enhance the efficiency of the PV cells supported on each of the structures 611-A to 611-K. In one embodiment, the electric output of each array of PV cells may be aggregated using an aggregator 650. In one embodiment, the output of the aggregator 650 may be provided as a first input on the path 615 to the selector 650. In one embodiment, the other input to the selector 650 may be provided on the path 625 from the power supply distribution system. In one embodiment, the selector 650 may select the power output provided by the PV cells and the power supply from the distribution system may be used as back-up.

In one embodiment, the power output from the selector 650 may be provided to a plurality of heat pump liquid heaters 400. However, for conciseness a single heat pump liquid heater 400 is shown in the FIG. 6.

Figure 7:
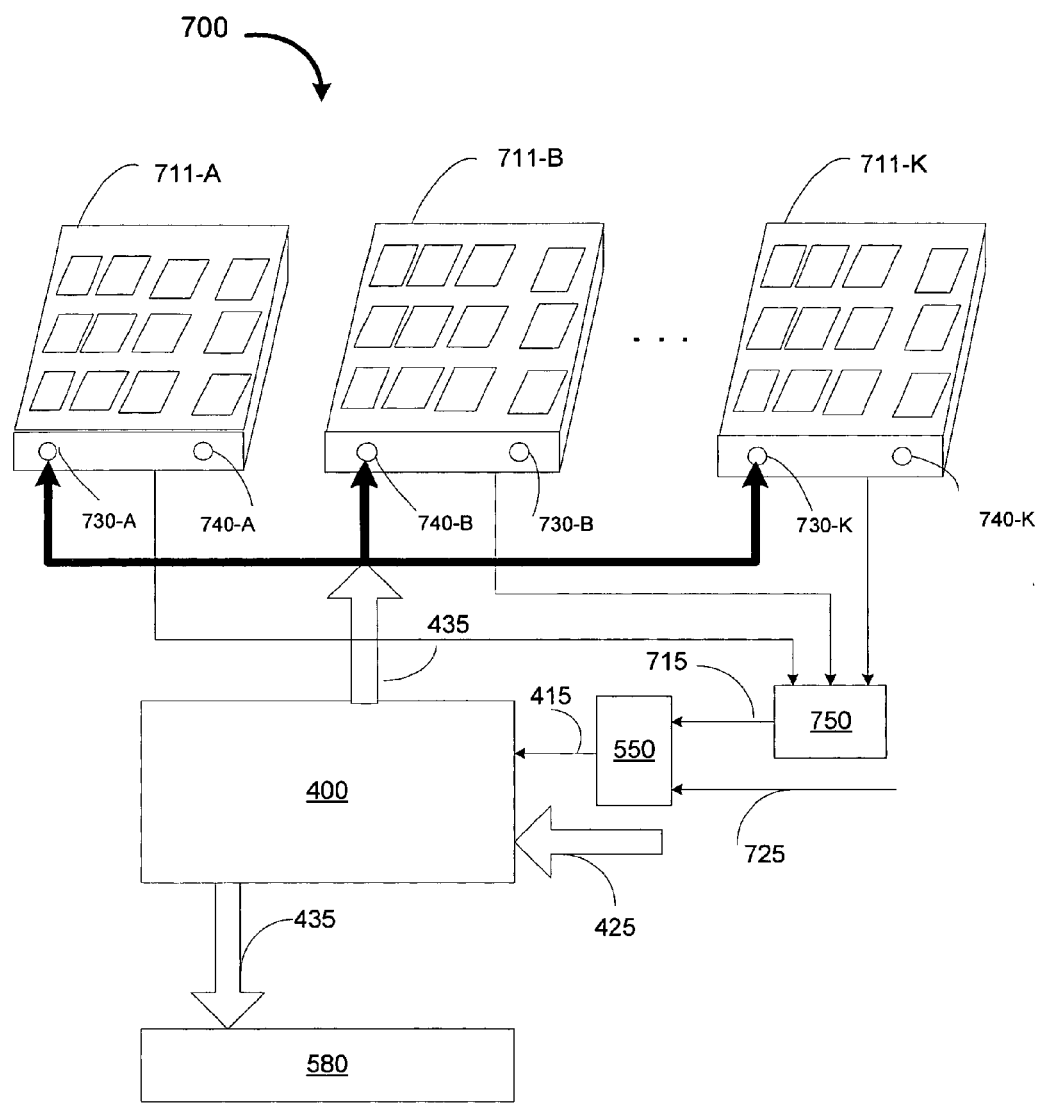
FIG. 7 illustrates a panel housing an efficient PV cell array, which is coupled to a heat pump liquid heater arranged in a third configuration in accordance with an embodiment.

An embodiment of a heat pump liquid heater coupled to an array of photovoltaic cells operating at enhanced efficiency and arranged according to a third configuration is illustrated in FIG. 7. In one embodiment, the heat generated by heat pump liquid heater 400 on the output 435 may be passed through a coil dipped in a liquid and the arrangement may be housed within block 580.

In one embodiment, the arrangement 700 may comprise a plurality of box structures 711-A to 711-K that may be similar to the box structure 511 of FIG. 5. Each of the structures 711-A to 711-K may comprise a circulation system and an array of PV cells. In one embodiment, the structures 711-A to 711-K may be arranged such that a first portion of the coolant may enter the first structure 711-A through the inlet 730-A and a second portion of the coolant may enter the second structure 711-B through the inlet 730-A. In one embodiment, the coolant may get circulated through the structures 711-A to 711-K in parallel. In one embodiment, the structures 711-A to 711-K may be arranged in a parallel configuration.

Such a parallel arrangement may be used to enhance the efficiency of the PV cells supported on each of the structures 711-A to 711-K. In one embodiment, the electric output of each array of PV cells may be aggregated using an aggregator 750. In one embodiment, the output of the aggregator 750 may be provided as a first input on the path 715 to the selector 550. In one embodiment, the other input to the selector 550 may be provided on the path 725 from the power supply distribution system. In one embodiment, the selector 750 may select the power output provided by the PV cells and the power supply from the distribution system may be used as back-up.

In one embodiment, the power output from the selector 750 may be provided to a plurality of heat pump liquid heaters 400. However, for conciseness a single heat pump liquid heater 400 is shown in the FIG. 7.

Figure 8:
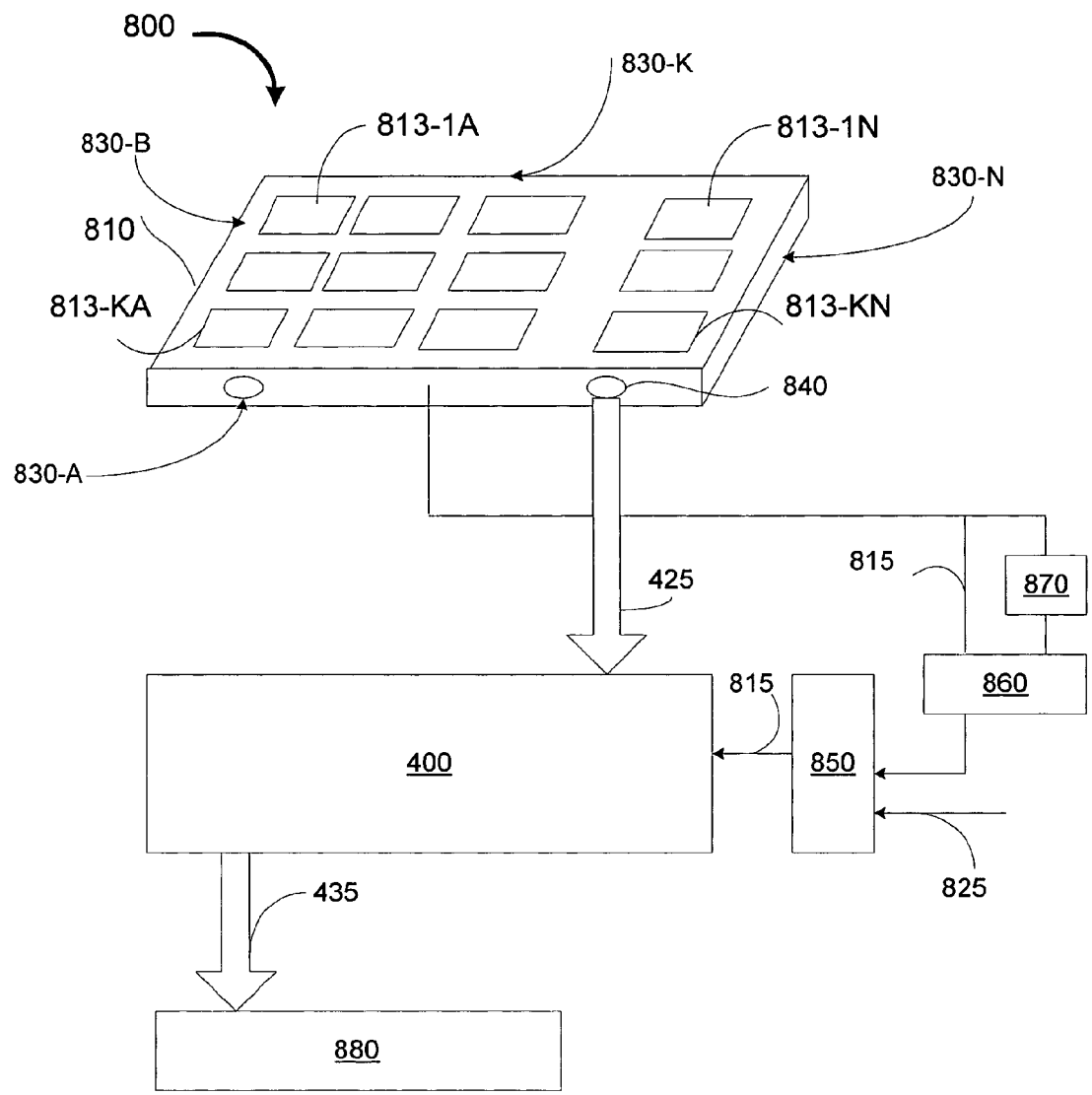
FIG. 8 illustrates an arrangement 800 in which the efficiency of the heat pump liquid heater may be enhanced using the PV cell array in accordance with an embodiment.

An embodiment of a heat pump liquid heater coupled to an array of photovoltaic cells, which enhances the heating capacity of the heat pump liquid heater is illustrated in FIG. 8.

In one embodiment, the electric power generated by the PV cells 813 may be provided as an input to a switch 860 on path 815 and the other input to the switch 860 may be provided from the inverter 870. In one embodiment, the electric power may be allowed to charge the batteries of an inverter 870 and the inverter output may be provided to the switch 860. In one embodiment, the output of the switch 860 may be provided as a first input to the selector 850 and the other input may be provided from the power supply distribution network on path 825.

In one embodiment, the arrangement 800 may comprise a box structure 810 that may be similar to the box structure 511 of FIG. 5. In one embodiment, the structure 810 may support passage of ambient air through the box structure 810. In one embodiment, the ambient air may pass through the box structure 810 as shown by air flow indicators 830-A to 830-N. In one embodiment, the air may pass around the PV cells and the passage of air around the PV cells 813 may cause the heat generated by the PV cells 813 to be transferred to the air.

In one embodiment, the ambient air that flows into the box structure 810 may be at a temperature of 'H' (=70-80) degree Fahrenheit and after the heat from the PV cells 813 get transferred to the ambient air, the temperature of the ambient air by rise by P degree Fahrenheit. In one embodiment, the value of P may equal 20 degree Fahrenheit. In one embodiment, the temperature of the air exiting the box structure 810 may equal (H+P) degree Fahrenheit. In one embodiment, the air exiting the box structure 810 may be provided as an input to the heat pump liquid heater 400 on path 425. In one embodiment, the heat pump liquid heater 400 may transfer the hot air received on path 425 to the condenser such as the condenser 430 and the condenser 430 may separate the heat form the hot air. In one embodiment, the heat may be passed through the coils dipped into the liquid that may be heated. As a result of providing an extra amount (P) of heat, the heating performance of the heat pumps liquid heater system 400 may be enhanced.

Figure 9:
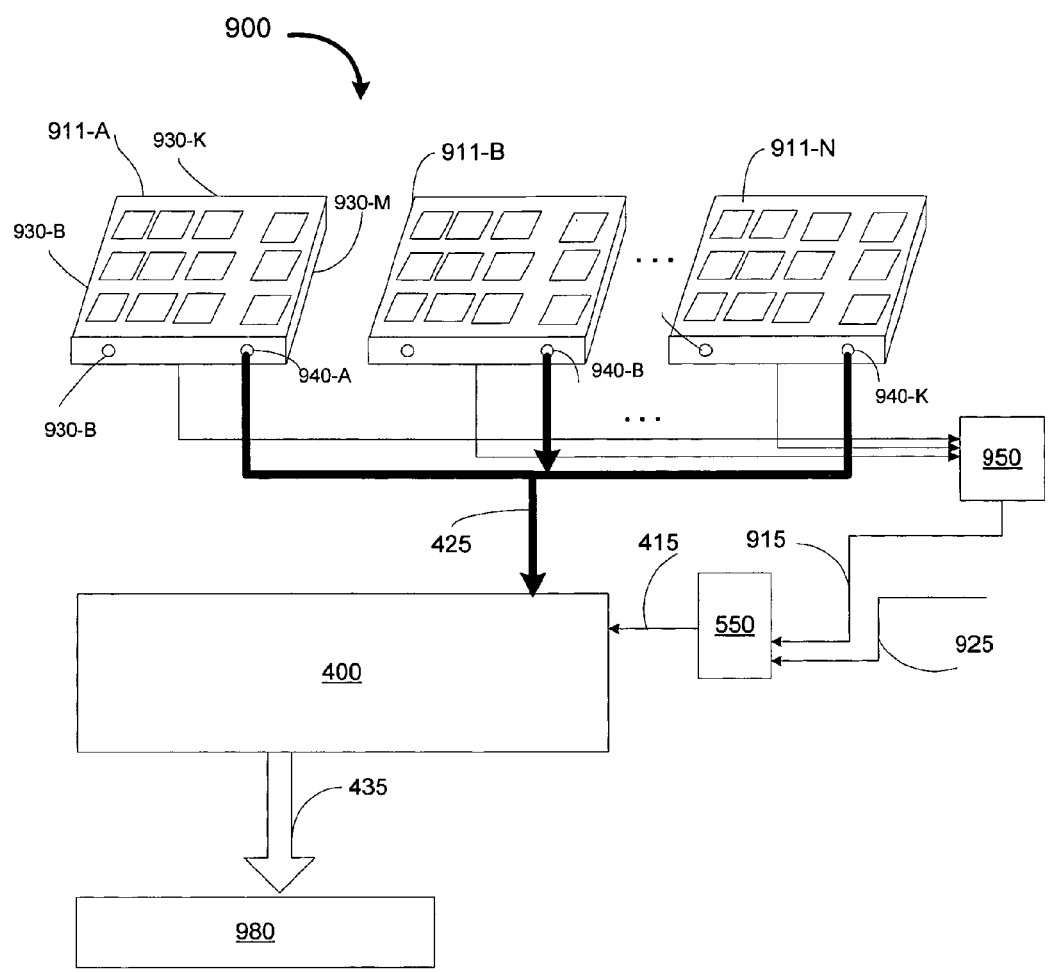
FIG. 9 illustrates an arrangement 900 in which the efficiency of the heat pump liquid heater may be enhanced using the PV cell array in accordance with an embodiment.

In one embodiment, other configurations comprising a plurality of box structures that support PV cells and air circulation mechanism may be possible. One such possible configuration is depicted in FIG. 9. In one embodiment, the arrangement 900 may comprise a plurality of box structures 911-A to 911-N, which may be similar to the box structure 511 described with reference to FIG. 5. As may be seen, the box structures 911-A to 911-K may provide hot air in response to receiving air at ambient temperature.

In one embodiment, the hot air output of each of the box structure 911 may be ducted to the evaporator of the heat pump liquid heater 400. As the heat pump liquid heater 400 receives hot air on path 425, the heat generated by the heat pump liquid heater 400 may increase. In one embodiment, the increase in the heat generated by the heat pump liquid heater 400 may enhance the efficiency of heating the liquid. In one embodiment, the electric power output of each of the box structures 911 may be aggregated using an aggregator 950 before providing the aggregated electric power to the selector 550.

Figure 10:
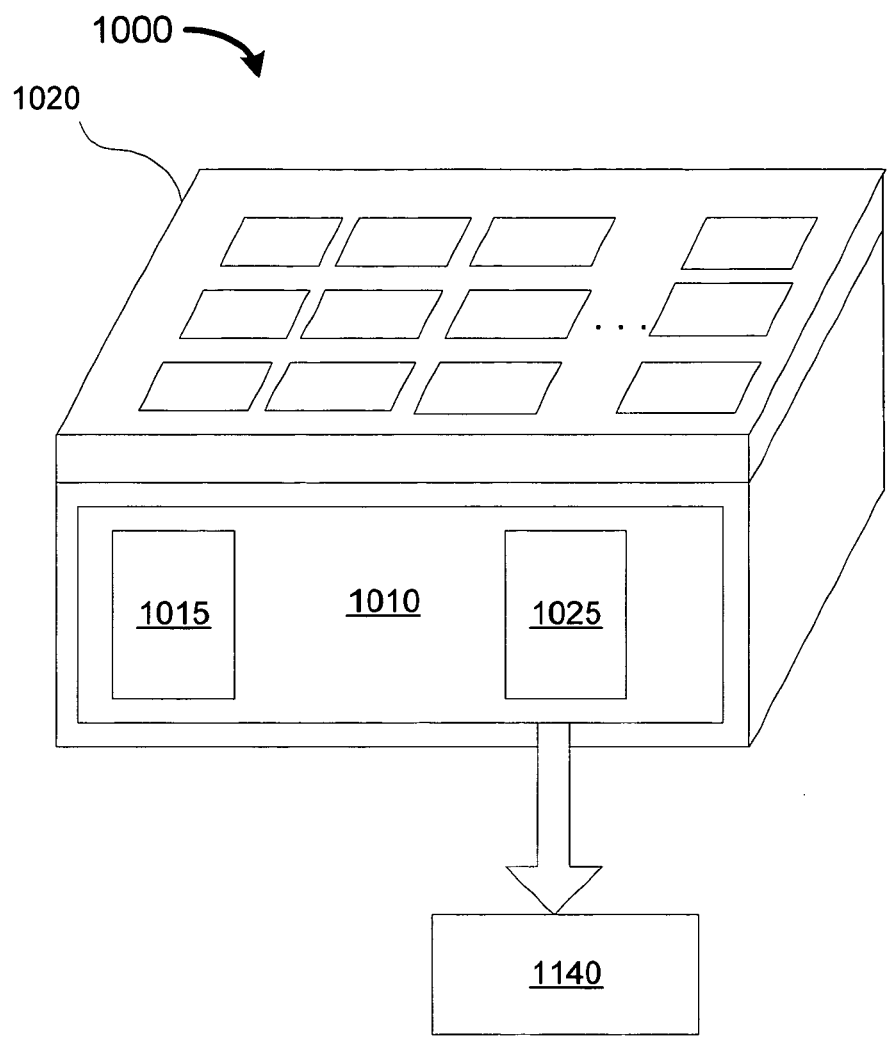
FIG. 10 illustrates an arrangement 1000 in which a heat pump liquid Heater evaporator may be integrated with PV cells mounted on a panel in accordance with an embodiment.

An embodiment of a heat pump liquid heater evaporator integrated with a panel comprising PC cells is illustrated in FIG. 10. In one embodiment, an arrangement 1000 may comprise a box structure 1020, which may support a plurality of PV cells such as the PV cells 513. In one embodiment, the heat pump liquid heater 1010 such as the heat pump liquid heater 400 may be, partially or completely, integrated into the box structure 1020. In one embodiment, the evaporator 1015 may be coupled to the lower surface of plate supporting the PV cells. In one embodiment, the evaporator 1015 may not comprise a fan as the source of heat may be derived from the light energy incident on the PV cells 513.

In one embodiment, the evaporator 1015 may directly cool the PV cells 513 by blowing the coolant over the PV cells 513. In one embodiment, the passage of coolant over the PV cells 513 may reduce the temperature of the PV cells 513 and thus increase the electric power generated by the PV cells 513. In one embodiment, the power generated by the PV cells 513 may be provided to a condenser 1025 of the heat pump liquid heater 1010. In one embodiment, the condenser coil 1140 may be provided as a heating source in a liquid tank, for example.

While the invention has been described with reference to a preferred embodiment, it will be understood by one of ordinary skill in the art that various changes may be made and equivalents may be substituted for elements thereof without departing from the scope of the present invention. In addition many modifications may be made to adopt a particular situation or material to the teachings of the present invention without departing from the essential scope thereof. Therefore, it is intended that the invention not be limited to the particular embodiments disclosed as the best mode contemplated for carrying out this invention, but that the invention will include all of the embodiments falling within the scope of the appended claims.

What is claimed is:

1. A heat pump liquid heater comprising:
   a evaporator, wherein the evaporator is to extract heat from hot air having a temperature above the ambient temperature,
   a condenser coupled to the evaporator, wherein the condenser is to generate a high-pressure and high-temperature air in liquid form in response to receiving the hot air,
   a compressor coupled to condenser, wherein the compressor is to remove heat from the hot air, and
   an expansion valve coupled to the compressor, wherein the expansion valve is to generate cool air in response to receiving air from the compressor,
   wherein hot air is generated by passing the ambient air through a photovoltaic cell panel.

2. The heat pump liquid heater of claim 1, wherein the temperature of the ambient air is increased above the ambient temperature by circulating the heat generated by the photovoltaic cells to the ambient air.

3. The heat pump liquid heater of claim 1, wherein the hot air is ducted to the evaporator.

4. The heat pump liquid heater of claim 1, further comprising a pipe coupled to an outlet through which the cool air is ducted to a plurality of photovoltaic cells through the pipe.

5. The heat pump liquid heater of claim 4, wherein the evaporator is provisioned without a fan, wherein the evaporator is providing the cool air directly to the photovoltaic cells.

* * * * *